United States Patent [19]

Svedberg

[11] Patent Number: 4,546,401
[45] Date of Patent: Oct. 8, 1985

[54] TWO-POLE OVERCURRENT PROTECTION DEVICE

[75] Inventor: Per Svedberg, Vällingby, Sweden

[73] Assignee: ASEA Aktiebolag, Västerås, Sweden

[21] Appl. No.: 578,383

[22] Filed: Feb. 8, 1984

[30] Foreign Application Priority Data

Jan. 16, 1983 [SE] Sweden .............................. 8300853

[51] Int. Cl.[4] .................. H02H 7/20; H01L 29/74
[52] U.S. Cl. ..................................... 361/91; 361/100; 361/111; 357/38; 357/23.1; 307/252 C
[58] Field of Search ............... 361/100, 91, 58, 111, 361/56; 307/252 C, 252 A, 252 B, 252 T, 252 N, 305, 200 A; 357/38, 39, 23

[56] References Cited

U.S. PATENT DOCUMENTS

| | | | |
|---|---|---|---|
| 3,263,128 | 7/1966 | White | 307/252 C |
| 3,303,360 | 2/1967 | Gentry | 307/252 C |
| 4,224,634 | 9/1980 | Svedberg | 357/39 X |
| 4,244,000 | 1/1981 | Veda et al. | 357/39 |
| 4,268,846 | 5/1981 | Spellman et al. | 307/252 C |
| 4,331,884 | 5/1982 | Svedberg | 361/91 X |
| 4,400,711 | 8/1983 | Avery | 357/38 |

Primary Examiner—Patrick R. Salce
Attorney, Agent, or Firm—Pollock, Vande Sande & Priddy

[57] ABSTRACT

A two-pole overcurrent protection device arranged to interrupt the current flowing in a conductor if the current exceeds a predetermined level employs a semiconductor wafer on which is formed a turn-off thyristor and a MOS transistor. The control electrode of the transistor is supplied with a voltage dependent on the on-state voltage drop of the thyristor and, therefore, on its current, and at a certain thyristor current the transistor short-circuits one of the emitter junctions of the thyristor to extinguish the thyristor. For firing the thyristor, one of the base layers thereof is supplied with a gate trigger current via a JFET transistor portion formed in the semiconductor wafer with a horizontal channel region. This transistor portion is designed so that its saturation current exceeds, with a suitable margin, the current necessary for firing the thyristor. When a high voltage exists across the thyristor, the transistor portion will limit the current flowing to the base layer to a value which is equal to the saturation current of the transistor portion.

7 Claims, 3 Drawing Figures

TWO-POLE OVERCURRENT PROTECTION DEVICE

BACKGROUND OF THE INVENTION

1. Field of the Invention

The present invention relates to a two-pole overcurrent protection device for connection into a current-carrying conductor. The protection device comprises a normally conducting turn-off thyristor having a semiconductor body with, in successive order, a first emitter layer, a first base layer, a second base layer and a second emitter layer. An MOS transistor is integrated with the thyristor and is parallel-connected to the PN junction of the latter between the first emitter layer and the first base layer. When the voltage across the thyristor exceeds a predetermined value, the MOS transistor short-circuits the PN junction and causes the thyristor to cease conducting.

2. Description of the Prior Art

Overcurrent protection devices of the above-mentioned kind are previously known from Svedberg U.S. Pat. No. 4,331,884 (issued May 25, 1982) and U.S. patent application Ser. No. 497,326 (applied for on the May 23, 1983 by Per Svedberg and assigned to the assignee of this application). Such known overcurrent protection devices comprise a thyristor, whose cathode-emitter junction can be shorted out by an MOS transistor integrated with the thyristor. The control electrode of the thyristor is connected to the anode-emitter via a resistor formed in the thyristor.

During normal operation, the thyristor receives a gate trigger current via this resistor and is made conducting as soon as its off-state voltage reaches a low positive value. The anode voltage of the thyristor is supplied to the control electrode of the normally non-conducting MOS transistor. The on-state voltage drop of the thyristor increases with increasing current, and, at a certain value of the thyristor current, the voltage of the control electrode of the transistor reaches the threshold voltage of the transistor. The transistor then becomes conducting and short-circuits the cathode-emitter junction of the thyristor, whereby the thyristor is turned off interrupting the current flow through the thyristor.

The thyristor then remains non-conducting until the voltage applied across the thyristor is again reduced to a low value, which, for example in the case of AC operation, occurs in the next cycle with the subsequent zero passage of the voltage.

In the above-mentioned known type of overcurrent protection device, the control electrode of the thyristor, as previously mentioned, is supplied with a gate trigger current from the anode via a resistor integrated with the thyristor. To obtain reliable ignition of the thyristor at a low off-state voltage, it is necessary for the resistance of this resistor not to be too high.

A sufficiently low resistance value, however, causes a high leakage current to flow through the resistor when the thyristor has been turned off to avoid an overcurrent and, therefore, the thyristor voltage is high. This leakage current gives rise to high losses in the overcurrent protection device and to insufficient isolation between the driving voltage and the object being protected by the device.

OBJECTS OF THE INVENTION

One object of the invention is to provide an overcurrent protection device of the type described above, in which a reliable firing of the thyristor is obtained at low off-state voltage while at the same time the leakage current existing in a turned-off thyristor is limited and, therefore, low losses and good isolation are obtained.

A further object of the invention is to provide an overvoltage protection device which is simple to manufacture by known photo-etching techniques using a semiconductor wafer and in which the area of the semiconductor wafer is utilized more efficiently than in connection with previously known devices.

SUMMARY OF THE INVENTION

The invention is characterised in that the thyristor of the overcurrent protection device is arranged to be supplied with a gate trigger current via a channel region with a first conduction type formed in the said semiconductor body, which channel region is disposed in the said semiconductor body adjacent to a region with the opposite conduction type in such a way that, of an increasing voltage across the said turn-off thyristor, the current flowing through the said channel region is limited.

BRIEF DESCRIPTION OF THE DRAWINGS

The invention will now be further described, by way of example, with reference to the accompanying drawings, in which.

DESCRIPTION OF THE PREFERRED EMBODIMENTS

Figure 1:
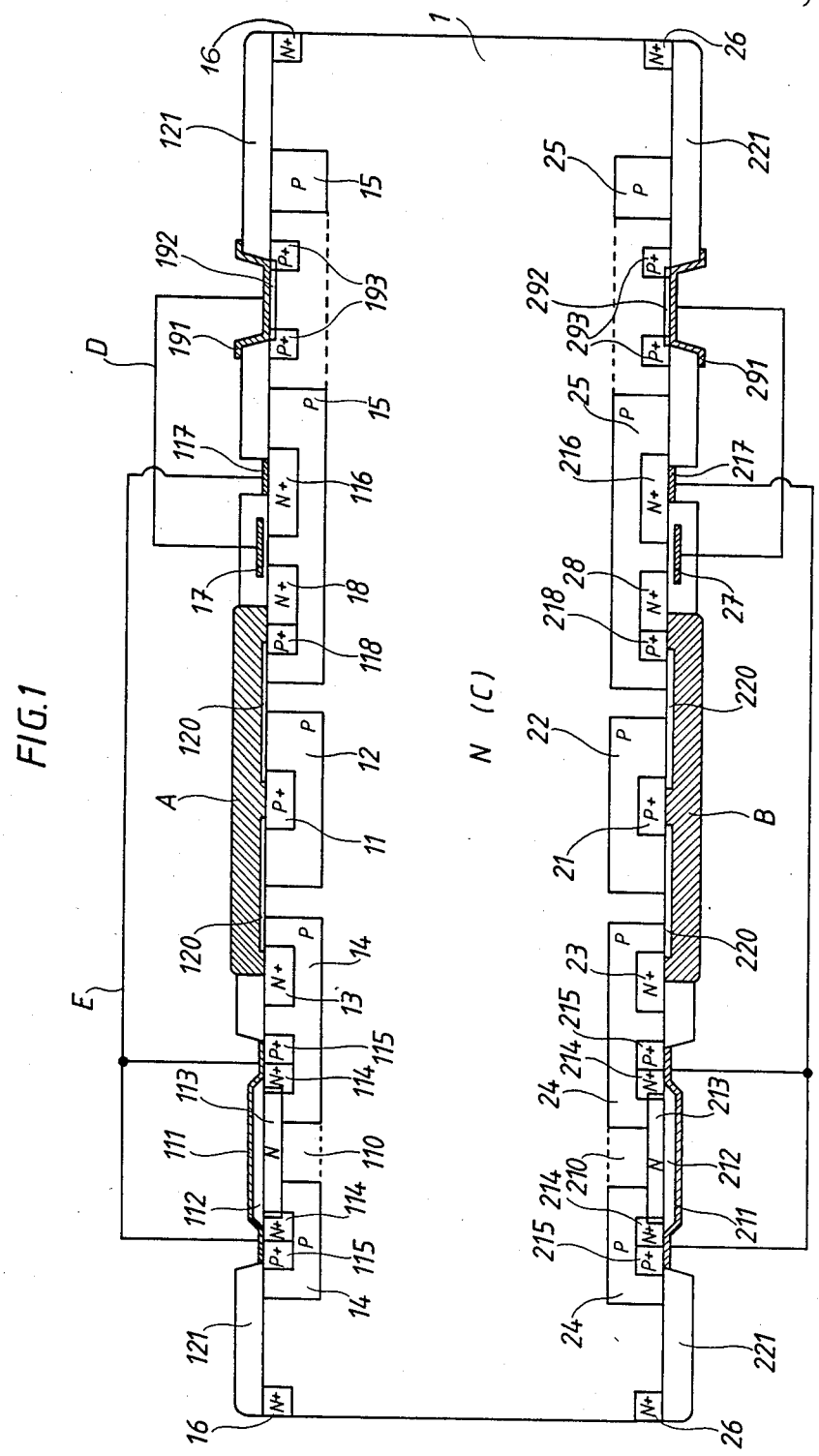
FIG. 1 is a sectional view through one embodiment of bidirectional overcurrent protection device according to the invention.

The overcurrent protection device shown in FIG. 1 is formed on a silicon wafer having an N-conducting main portion 1. In the upper surface of the wafer as shown in FIG. 1 there is formed a central P-conducting layer 12, which is surrounded by P-conducting layers 14, 15. In the lower surface of the wafer there is formed, in the same way, a central P-conducting layer 22 and surrounding P-conducting layers 24, 25. In each of the layers 12 and 22 there is respectively arranged a heavily P-doped region 11 and 21. The regions 11 and 21 of the layers 12 and 22 are electrically contacted by respective terminal contacts A and B of the protection device.

Figure 2:
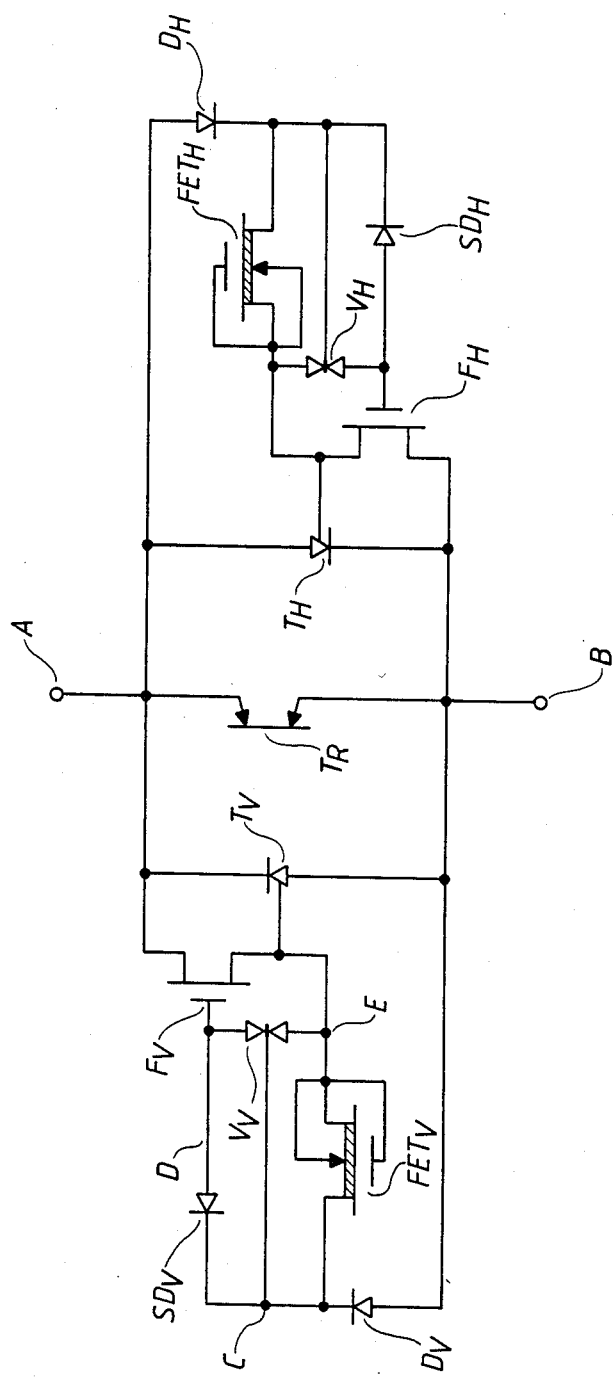
FIG. 2 is an equivalent circuit diagram of the overcurrent protection device of FIG. 1.

In the P-conducting layer 14 an N+-conducting layer 13 is arranged, which is electrically contacted by the contact A. The layers 11, 12, 1, 22 and 21 constitute a PNP transistor, which in the equivalent circuit of FIG. 2 is designated TR. The layers 21, 22, 1, 14 and 13 constitute a thyristor which is designated $T_V$ in FIG. 2.

A description of the construction and function of the unidirectional overcurrent protection device which consists of the contact B, the layers 21, 22 and 1 and the layers and contacts arranged in the upper surface of the wafer will now be given, that is, the transistor TR and the thyristor $T_V$ with components, connected to the latter, for causing the thyristor $T_V$ to conduct and to cease conducting.

To obtain a bidirectional overcurrent protection device, the lower surface of the silicon wafer is formed in precisely the same way as the upper surface. The layers and the contacts have the same designations as the corresponding units in the upper surface, but with "2" as the first figure instead of "1" in FIG. 1 and with the subscript "H" instead of "V" in the designations used in FIG. 2. Thus, the thyristor $T_H$ in FIG. 2 consists of layers 11, 12, 1, 24, 23, and the components for causing this thyristor to conduct and to cease conducting are arranged in the lower surface of the wafer.

The function of the thyristor $T_V$ and the transistor portion TR will now be described. The thyristor $T_H$ with its elements for firing and extinction, arranged on the lower surface of the wafer in FIG. 1, has the same construction and function. The protection device shown in the Figures is bidirectional, that is, it functions for both the current and voltage directions. If desired, the protection device of FIG. 1 could be made unidirectional, for example by omitting, in the lower surface of the wafer, all the layers and contacts shown in FIG. 1 except the layers 21 and 22, and their electrical contact B.

The NPN section 13, 14, 1 of the thyristor $T_V$ has a current dependent injection efficiency. At a high current, the injection efficiency of the emitter layer 13 drops. This results in the total current amplification of the thyristor $T_V$ decreasing and approaching unity, which in turn results in an increase in the on-state voltage drop of the thyristor. This occurs at a current density of, for example, $10^5$ A/cm$^2$. By selection of the relation between the area of the layer 14 and the total area of the layers 12 and 15, the effective amplification for holes in the thyristor system can be controlled, and it is thus possible to determine the thyristor current at which the on-state voltage drop starts to increase significantly.

The contact A is isolated from the layers 1, 12, 14 and 15 with the aid of underlying silicon dioxide layers 120. One or more P+ layers 118 with a small extension in relation to the layer 18 provide(s) short-circuiting of the emitter junction 18-15 and prevent an otherwise parasitic thyristor portion consisting of the layers 21, 22, 1, 15, 18, from being made conducting.

On its upper surface, the semiconductor wafer is provided at its edge with an N+-doped region 16 for preventing surface leakage currents. The upper surface of the wafer is covered with a layer 121 of silicon dioxide, which is provided with openings where required for the various electrical contacts.

An MOS transistor (shown at $F_V$ in FIG. 2) is provided for extinguishing the thyristor $T_V$ on the appearance of an overcurrent and comprises a N-conducting layer 116 which, together with layers 18 and 15 and a control electrode 17, forms a MOSFET transistor of enhancement type with a P-conducting channel region. The layer 116 also has a contact 117 which, by way of a conductor E, is connected to a contact 111 and thereby, by way of a layer 115, to the P-conducting layer 14 forming the base of the thyristor $T_V$. Via a conductor D, the control electrode 17 is connected to a platinum contact layer 191, below which a thin layer 192 is transformed into platinum silicide and forms a Schottky diode with the layer 1, A ring 193 of P+-conducting silicon is arranged around the edge of the Schottky diode. The Schottky diode is located in an opening in the layer 15.

When a positive voltage exists across the thyristor $T_V$ (i.e. when conductor B is positive relative to conductor A), the control electrode 17 receives positive voltage via the junction 22-1 (diode $D_V$ in FIG. 2) and the Schottky diode ($SD_V$ in FIG. 2). The MOS transistor (116, 18, 15, 17) is dimensioned so as to become conducting at a desired on-state voltage drop across the thyristor $T_V$, whereby it short-circuits the junction between the layers 13 and 14 and stops the thyristor conducting. The distance between the ring 193 and the layer 15 is so chosen that the voltage, at which the barrier layer at the junction between layers 1 and 15 penetrates to the ring layer 193, is lower than the breakdown voltage of the control electrode 17. In this way the MOS transistor $F_V$ is protected against high thyristor voltages. The layers 193, 1 and 15 may be viewed as a PNP varistor, which is designated $V_V$ in FIG. 2.

The gate trigger current to the thyristor $T_V$ is supplied to the P base layer 14 via a JFET transistor with a horizontal channel region. This is designated $FET_V$ in FIG. 2 and is shown in more detail in FIG. 3. The layer 14 is provided with an opening 110. A layer 113 of the semiconductor wafer located nearest the upper surface is N-conducting. At each edge of the layer 113 there is arranged an N+-conducting layer 114 and close to it a P+-conducting layer 115. The layer 113 is covered with a thin silicon dioxide layer 112. On top of this and in contact with the layers 114 and 115, a contact layer 111 is provided, which is connected to the contact 117 via the conductor E.

Figure 3:
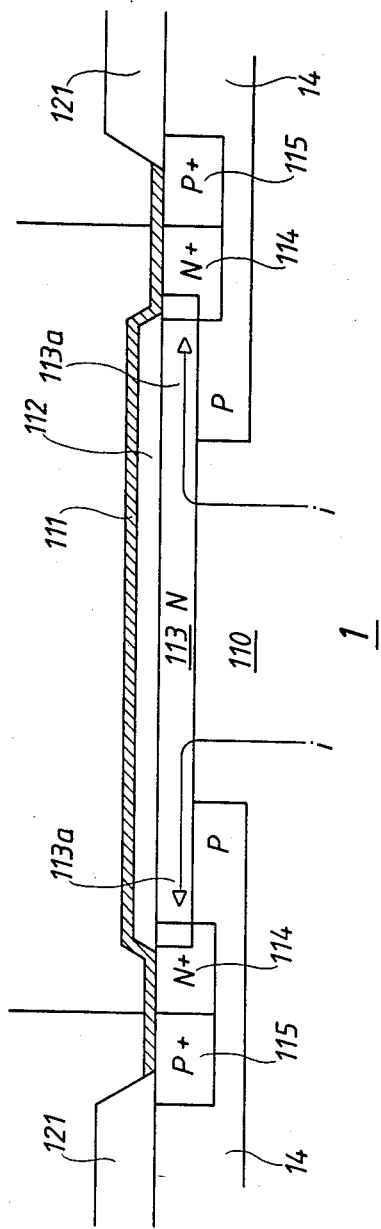
FIG. 3 is a scrap view on an enlarged scale, of one part of the device of FIG. 1.

When an off-state voltage exists across the thyristor $T_V$ (i.e. the contact B is positive relative to the contact A), current flows from the contact B via the layer 21, the layers 22 and 1 (diode $D_V$ in FIG. 2), the opening 110, the channel layer 113, the layer 114, the contact layer 111 and the layer 115 to the P base layer 14 of the thyristor (see the arrows "i" in FIG. 3). The current causes lateral voltage drops in outer regions 113a of the channel layer 113, which biases the junction between the layer 113 and layer 114 in the inverse direction. At increasing current, the barrier layer spreads upwardly in the channel region 113a and throttles the channel layer 113 to an increasing extent. In the same way as happens with a conventional JFET transistor, the channel portion 113a therefore has a saturation current which cannot be exceeded. This saturation current may be set at the desired value by a suitable choice of the doping concentration in the length of and the thickness of the channel layer 113. The saturation current is set at a value which permits reliable ignition of the thyristor $T_V$. At high values of the thyristor voltage which may occur when the thyristor has been extinguished by means of the field effect transistor $F_V$, the JFET transistor will operate as a constant current source and automatically limit its current to a value equal to the saturation current.

In an overcurrent protection device according to the invention, greatly reduced losses are obtained compared with previously known overcurrent protection devices of the same type. Further, a considerably improved isolation is obtained between the driving voltage and the object being protected from overvoltages. Furthermore, the complicated control current-limiting resistors (for example of spiral or meander form) used in connection with the previously known overcurrent protection devices, are not required with a protection device according to the invention. For one thing, this is an advantage from the manufacturing point of view, and for another the relatively great loss of effective area, which these resistors involve, is avoided.

The above described design of an overcurrent protection device using a JFET transistor with a horizontal channel layer for supplying the gate trigger current to the control layer of the thyristor, has the additional advantage that the breakdown voltage of the protection device (the thyristor) is not detrimentally affected. This effect is accentuated by the fact that the contact 111, which covers the entire opening 110 formed in the P base layer 14, serves as a field plate and prevents irregularities of the field at this opening.

In the JFET transistor portion shown in FIGS. 1 and 3, the opening 110 may be square and have a side of 20–40 microns. The channel region 113$a$ may have the same width (20–40 microns) but a length which is so much greater that it extends 20–40 microns from the opening (to the right and to the left in the Figures). The thickness of the P base layer 14 may be 10 microns and the thickness of the channel layer 113 may be 0.5 microns. The doping concentration of the N base layer 1 may be at a level of $10^{14} cm^{-3}$. The layer 14 may be generated by ion implantation of boron to a surface concentration of $10^{13} cm^{-2}$ followed by diffusion to the desired depth. The channel layer 113 is generated by ion implantation of phosphorus to a surface concentration of $3 \times 10^{11}$ to $3 \times 10^{12} cm^{-2}$. The N+ region 114 and the P+ region 115 may thereafter be generated by implantation of suitable impurities. A JFET section constructed in this manner receives a saturation current of the order of magnitude of one or a few hundred $\mu A$, which may be a suitable value for an overcurrent protection device with a rated current of a few hundred milliamperes and a rated voltage of a few hundred volts.

To obtain an increased current handling capacity, a number of mutually identical units according to FIG. 2 may be integrated in one and the same silicon wafer.

The specific design of overcurrent protection device described with reference to the accompanying drawings may be modified in many ways and all such modifications falling within the spirit and scope of the following claims constitute embodiments of the present invention.

What is claimed is:

1. A two-pole overcurrent protection device for connection into a current-carrying conductor which device comprises a normally conducting turn-off thyristor having a semiconductor body with, in successive order, a first emitter layer, a first base layer, a second base layer and a second emitter layer, an MOS transistor integrated with the thyristor and connected in parallel with a PN junction of the turn-off thyristor existing between the first emitter layer and the first base layer, which MOS transistor is arranged, when the voltage across the turn-off thyristor exceeds a predetermined value, to short-circuit the said PN junction and cause the turn-off thyristor to cease conducting, characterized in that the said turn-off thyristor is arranged to be supplied with a gate trigger current via a channel region with the same conduction type as the second base layer of the thyristor and arranged adjacent this layer, the channel region being located between a part of the first base layer of the thyristor and a surface of the semiconductor, whereby current through said channel region will flow substantially parallel to said surface and, with an increasing voltage across the thyristor the current through said channel region is limited.

2. An overcurrent protection device according to claim 1, in which the region of the opposite conduction type consists of the said first base layer of the turn-off thyristor.

3. An overcurrent protection device according to claim 1, in which the said first base layer of the turn-off thyristor is provided with an opening through which the second base layer of the turn-off thyristor extends up to the said surface of the semiconductor body, and in which the said channel region is arranged at the edge of the said opening.

4. An overcurrent protection device according to claim 2, in which the said first base layer of the turn-off thyristor is provided with an opening through which the second base layer of the turn-off thyristor extends up to the said surface of the semiconductor body, and in which the said channel region is arranged at the edge of the said opening.

5. An overcurrent protection device according to claim 3, in which a conducting layer, electrically connected to the first base layer of the turn-off thyristor is arranged on an electrically insulating layer applied across the said channel region and the said opening.

6. An overcurrent protection device according to claim 4, in which a conducting layer, electrically connected to the first base layer of the turn-off thyristor is arranged on an electrically insulating layer applied across the said channel region and the said opening.

7. A bidirectional overcurrent protection device as claimed in claim 1, in which a second MOS transistor and a second channel region are integrated with the turn-off thyristor in the same semiconductor body.

* * * * *